(12) United States Patent  
Tanabe

(10) Patent No.: US 8,197,992 B2  
(45) Date of Patent: Jun. 12, 2012

(54) PHOTOMASK BLANK, PHOTOMASK BLANK MANUFACTURING METHOD, AND PHOTOMASK MANUFACTURING METHOD

(75) Inventor: Masaru Tanabe, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 172 days.

(21) Appl. No.: 12/620,805

(22) Filed: Nov. 18, 2009

(65) Prior Publication Data

US 2010/0124711 A1 May 20, 2010

(30) Foreign Application Priority Data

Nov. 19, 2008 (JP) ................................. 2008-295142

(51) Int. Cl.  
*G03F 1/00* (2012.01)

(52) U.S. Cl. .......................................................... 430/5
(58) Field of Classification Search ...................... 430/5  
See application file for complete search history.

(56) References Cited

U.S. PATENT DOCUMENTS 6,335,124 B1 * 1/2002 Mitsui et al. ...................... 430/5

FOREIGN PATENT DOCUMENTS

JP 2002-156742 A 5/2002

* cited by examiner

*Primary Examiner* — Mark F Huff  
*Assistant Examiner* — Jonathan Jelsma  
(74) *Attorney, Agent, or Firm* — Sughrue Mion, PLLC

(57) ABSTRACT

A photomask blank manufacturing method that forms, on a light-transmissive substrate, a thin film for forming a transfer pattern, thereby producing a thin-film coated substrate and then presses the thin-film coated substrate. The pressing is carried out, for example, by a cold isostatic pressing method in a range of 1000 to 10000 atmospheric pressure.

10 Claims, 4 Drawing Sheets

PHOTOMASK BLANK, PHOTOMASK BLANK MANUFACTURING METHOD, AND PHOTOMASK MANUFACTURING METHOD

This application is based upon and claims the benefit of priority from Japanese patent application No. 2008-295142, filed on Nov. 19, 2008, the disclosure of which is incorporated herein in its entirety by reference.

TECHNICAL FIELD

This invention relates to methods of manufacturing a photomask blank and a photomask improved in light fastness and, in particular, relates to a method of manufacturing a photomask blank for use in manufacturing a photomask to be suitably used in an exposure apparatus using exposure light having a short wavelength of 200 nm or less and to a method of manufacturing such a photomask.

BACKGROUND ART

Generally, fine pattern formation is carried out by photolithography in the manufacture of a semiconductor device. A number of substrates called photomasks are normally used for such fine pattern formation. The photomask comprises generally a light-transmissive glass substrate having thereon a fine pattern made of a metal thin film or the like. The photolithography is used also in the manufacture of the photomask.

In the manufacture of a photomask by photolithography, use is made of a photomask blank having a thin film (e.g. a light-shielding film) for forming a transfer pattern (mask pattern) on a light-transmissive substrate such as a glass substrate. The manufacture of the photomask using the photomask blank comprises an exposure process of writing a required pattern on a resist film formed on the photomask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the photomask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the light-transmissive substrate. In this manner, the photomask is produced.

For miniaturization of a pattern of a semiconductor device, it is necessary to shorten the wavelength of exposure light for use in photolithography in addition to miniaturization of the mask pattern of the photomask. In recent years, the wavelength of exposure light for use in the manufacture of a semiconductor device has been shortened from KrF excimer laser light (wavelength: 248 nm) to ArF excimer laser light (wavelength: 193 nm).

As a type of photomask, a halftone phase shift mask is known apart from a conventional binary mask having a light-shielding film pattern made of a chromium-based material on a light-transmissive substrate. This halftone phase shift mask is configured to have a phase shift film on a light-transmissive substrate. This phase shift film is made of, for example, a material containing a molybdenum silicide compound and is adapted to transmit light having an intensity that does not substantially contribute to exposure (e.g. 1% to 20% with respect to an exposure wavelength) and to produce a predetermined phase difference. By the use of light-semitransmissive portions formed by patterning the phase shift film and light-transmissive portions formed with no phase shift film and adapted to transmit light having an intensity that substantially contributes to exposure, the halftone phase shift mask causes the phase of the light transmitted through the light-semitransmissive portions to be substantially inverted with respect to that of the light transmitted through the light-transmissive portions so that the lights having passed near the boundaries between the light-semitransmissive portions and the light-transmissive portions and bent into the others' regions due to diffraction cancel each other out. This makes the light intensity at the boundaries approximately zero to thereby improve the contrast, i.e. the resolution, at the boundaries.

In recent years, there have also appeared a binary mask using a material containing a molybdenum silicide compound as a light-shielding film, and the like.

With respect to the photomask and the photomask blank, the miniaturization of the mask pattern of the photomask requires a reduction in thickness of the resist film formed on the photomask blank and dry etching as a patterning technique in the manufacture of the photomask.

However, the reduction in thickness of the resist film and the dry etching have the following technical problems.

One problem is that, for example, the processing time of the light-shielding film exists as one serious restriction to the reduction in thickness of the resist film on the photomask blank. Chromium is generally used as a material of the light-shielding film and, in dry etching of chromium, a mixed gas of chlorine gas and oxygen gas is used as an etching gas. When patterning the light-shielding film by dry etching using the resist pattern as a mask, since the resist film is an organic film mainly composed of carbon, it is very weak against an oxygen plasma forming a dry etching environment. While patterning the light-shielding film by dry etching, the resist pattern formed on the light-shielding film should remain with a sufficient thickness. As one index, in order to make excellent the sectional shape of the mask pattern, the resist film is required to have a thickness that still remains even when the etching time is about twice a just etching time (100% overetching). For example, since, in general, the etching selectivity of chromium as the material of the light-shielding film to the resist film is 1 or less, the thickness of the resist film is required to be twice or more that of the light-shielding film. Therefore, it is necessary to shorten the processing time of the light-shielding film for reducing the thickness of the resist film and, for that purpose, it is important to reduce the thickness of the light-shielding film.

The pattern miniaturization has advanced to require a pattern line width smaller than an exposure wavelength (ArF excimer laser light: 193 nm) so that hyper-NA exposure with a numerical aperture NA>1, for example, immersion exposure, has been developed and started to be used.

The immersion exposure is an exposure method that can improve the resolution by filling a liquid between a wafer and a lowermost lens of an exposure apparatus so that the numerical aperture is increased by the refractive index of the liquid times as compared with that in the case of air whose refractive index is 1. The numerical aperture is given by NA=n×sin θ, where θ represents an angle formed between a light ray incident on the lowermost lens of the exposure apparatus at its outermost portion and the optical axis and n represents a refractive index of a medium between a wafer and the lowermost lens of the exposure apparatus.

In this immersion exposure, an incident angle of exposure light to a photomask (an angle formed between a normal of a substrate and incident light) needs to be increased (oblique incidence). However, if this incident angle to the photomask is increased, there arises a problem of shielding effect (shadowing) which adversely affects the resolution. Specifically, when the exposure light is obliquely incident on a side wall of a pattern of the photomask, a shadow is formed due to a three-dimensional structure (particularly height) of the pattern. Because of this shadow, the size of the pattern of the photomask cannot be accurately transferred and the amount of light is reduced (less bright).

Therefore, it is necessary to reduce the height of the side wall of the pattern, i.e. the thickness of the light-shielding film.

DISCLOSURE OF THE INVENTION

Following the reduction in exposure light wavelength in recent years, however, mask degradation due to repeated use of a photomask has become notable. Particularly in the case of a phase shift mask, a phenomenon occurs in which the transmittance and the phase difference change and further the line width changes (increases) due to irradiation of ArF excimer laser light (wavelength: 193 nm). In the case of the phase shift mask, such changes in transmittance and phase difference are serious problems that affect the mask performance. Particularly, if the change in phase difference becomes large, the phase shift effect at the pattern boundaries is difficult to obtain so that the contrast at the pattern boundaries is lowered and thus the resolution is significantly reduced. Further, the change in line width degrades the CD (critical dimension) accuracy of the photomask and finally degrades the CD accuracy of a pattern-transferred wafer.

The problem of the mask degradation due to the repeated use of the photomask is significant particularly in the case of the phase shift mask as described above, but, also in the case of a binary mask having a chromium light-shielding film, there arises a problem of degradation in CD accuracy due to a change (increase) in line width of the chromium light-shielding film.

According to the study of the present inventor, the background of this problem is assumed as follows. Conventionally, for example, when haze is generated, cleaning is carried out for removing the haze, but a film loss (dissolution) due to the cleaning cannot be avoided and thus, roughly, the number of times of cleaning determines the mask lifetime. However, since the number of times of cleaning is reduced due to an improvement to haze in recent years, the period of time of repeated use of a photomask is prolonged and thus the exposure time is prolonged correspondingly, and therefore, a problem of light fastness particularly to short-wavelength light such as ArF excimer laser light has been newly actualized.

Also conventionally, in order to improve the light fastness of a phase shift film or a light-shielding film, for example, the film forming conditions are adjusted to change the properties of the film or annealing is carried out in an oxygen atmosphere after the film formation to form an oxide layer (barrier layer) at a surface of the film (Patent Document 1: Japanese Unexamined Patent Application Publication (JP-A) No. 2002-156742). However, a further improvement in light fastness of a film to exposure light is required in the course of the reduction in wavelength of exposure light in recent years.

On the other hand, as described before, the reduction in thickness of a light-shielding film is required for improving the resolution in the photomask fabrication and for adaptation to the problem of the immersion exposure. Further, since the photomask manufacturing cost has been increasing following the pattern miniaturization, there is an increasing need for a longer lifetime of a photomask and thus a further improvement is required also for chemical resistance and hot water resistance of the photomask.

This invention has been made for solving at least one of the above-mentioned problems and has an object, firstly, to provide photomask blank and photomask manufacturing methods that can improve the light fastness of a phase shift film or a light-shielding film to exposure light having a wavelength of 200 nm or less, thereby improving the lifetime of a photomask.

Secondly, an object of this invention is to provide photomask blank and photomask manufacturing methods that enable a reduction in thickness of a phase shift film or a light-shielding film.

The present inventor has assumed a cause of degradation of a photomask due to its repeated use becoming notable following the reduction in exposure light wavelength, as follows.

As a result of examining a phase shift film pattern of a phase shift mask subjected to changes in transmittance and phase difference and a change (increase) in line width due to its repeated use, the present inventor has found that a modified layer containing $SiO_2$ is formed on the surface layer side of a MoSi film and this is one of main causes of the changes in transmittance, phase difference, and line width. The reason for the formation of such a modified layer is considered as follows. That is, it is considered that the conventional sputtered MoSi film (phase shift film) structurally has gaps and, even if annealing is carried out after the film formation, the change in structure of the MoSi film is small, and therefore, for example, oxygen, water, or the like enters the gaps in the course of using the photomask to form the modified layer on the surface layer side of the MoSi film and the thickness of the modified layer gradually increases (the occupation ratio of the modified layer in the MoSi film gradually increases) due to irradiation of exposure light (particularly short-wavelength light such as ArF excimer laser light). This phenomenon of the formation of the modified oxide layer is significantly observed in the case of short-wavelength exposure light such as ArF excimer laser light having energy necessary for converting oxygen to ozone.

The present inventor has completed this invention as a result of further continuing intensive studies based on the elucidated fact and consideration described above.

Specifically, in order to achieve the above-mentioned objects, this invention has the following structures.

(Structure 1)

A photomask blank comprising a light-transmissive substrate, and a thin film that is formed on the light-transmissive substrate and adapted to form a transfer pattern, wherein when the thin film is pressed at 4000 atmospheric pressure, a reduction ratio of a thickness of the thin film after pressing is 2% or less.

(Structure 2)

The photomask blank according to Structure 1, wherein the photomask blank is a photomask blank that manufactures a photomask for use in an exposure apparatus using exposure light having a wavelength of 200 nm or less.

(Structure 3)

The photomask blank according to Structure 1, wherein the thin film is a phase shift film made of a material containing a compound of transition metal silicide.

(Structure 4)
The photomask blank according to Structure 1, wherein the thin film is a light-shielding film made of a material containing a compound of transition metal silicide.

(Structure 5)
The photomask blank according to Structure 3 or 4, wherein the transition metal silicide is molybdenum silicide.

(Structure 6)
The photomask blank according to Structure 1, wherein the thin film is a light-shielding film made of a material containing chromium.

(Structure 7)
A method of manufacturing a photomask blank comprising a light-transmissive substrate, and a thin film that is formed on the light-transmissive substrate and adapted to form a transfer pattern, wherein the method comprises forming the thin film on the light-transmissive substrate to produce a thin-film coated substrate, and pressing the thin-film coated substrate.

(Structure 8)
The method according to the Structure 7, wherein the pressing is carried out by a cold isostatic pressing method in a range of 1000 to 10000 atmospheric pressure.

(Structure 9)
The method according to the Structure 7 or 8, wherein the photomask blank is a photomask blank that manufactures a photomask for use in an exposure apparatus using exposure light having a wavelength of 200 nm or less.

(Structure 10)
The method according to any one of the Structures 7 to 9, wherein the thin film is a phase shift film made of a material containing a compound of transition metal silicide.

(Structure 11)
The method according to any one of the Structures 7 to 9 wherein the thin film is a light-shielding film made of a material containing a compound of transition metal silicide.

(Structure 12)
The method according to the Structure 10 or 11, wherein the transition metal silicide is molybdenum silicide.

(Structure 13)
The method according to any one of the Structures 7 to 9, wherein the thin film is a light-shielding film made of a material containing chromium.

(Structure 14)
A method of manufacturing a photomask, comprising a step of patterning the thin film in the photomask blank according to any one of the Structures 1 to 13 by etching.

(Structure 15)
A method of manufacturing a photomask comprising a transfer pattern on a light-transmissive substrate, wherein the method comprises forming a thin film on the light-transmissive substrate to produce a photomask blank, patterning the thin film by etching to form the transfer pattern, and pressing the transfer pattern.

(Structure 16)
The method according to the Structure 15, wherein the pressing is carried out by a cold isostatic pressing method in a range of 1000 to 10000 atmospheric pressure.

As recited in the Structure 7, a photomask blank manufacturing method of this invention is a method of manufacturing a photomask blank having a light-transmissive substrate, and a thin film that is formed on the light-transmissive substrate and adapted to form a transfer pattern and comprises forming the thin film on the light-transmissive substrate to produce a thin-film coated substrate and then pressing the thin-film coated substrate.

According to this invention, by pressing the thin-film coated substrate produced by forming the thin film on the light-transmissive substrate, the thin film is squeezed so that the film structure becomes dense (the film density increases), and therefore, the thin film hardly receives the above-mentioned attack by oxygen, water, or the like and thus it is possible to suppress the formation of the above-mentioned modified layer. Accordingly, even if a photomask is repeatedly used with short-wavelength light such as ArF excimer laser light as exposure light, changes in transmittance, phase difference, and line width of, for example, a phase shift film are suppressed. Further, the chemical resistance and hot water resistance are also improved.

Since the film structure of the thin film becomes dense (the film density increases) by pressing the thin-film coated substrate, in the case of, for example, a light-shielding film, a predetermined optical density is obtained even if the thickness thereof is thinner than conventional, and therefore, it is suitable for a reduction in thickness of a resist film and thus for formation of a fine pattern. Since the height of a pattern side wall of the light-shielding film after the mask fabrication can be reduced, it is suitable for a photomask for use in the immersion exposure technique.

As recited in the Structure 1, a photomask blank having a light-transmissive substrate, and a thin film that is formed on the light-transmissive substrate and adapted to form a transfer pattern according to this invention is such that when the thin film is pressed at 4000 atmospheric pressure, the reduction ratio of the thickness of the thin film after the pressing is 2% or less. In the case of the photomask blank obtained by once pressing a thin-film coated substrate produced by forming the thin film on the light-transmissive substrate, even if the thin film is pressed again at 4000 atmospheric pressure, the reduction ratio of the thickness of the thin film after the pressing becomes very small, i.e. 2% or less.

As recited in the Structure 8, the pressing of the thin-film coated substrate is preferably carried out by the cold isostatic pressing method in the range of 1000 to 10000 atmospheric pressure. According to the cold isostatic pressing method, since the entire surfaces of the thin-film coated substrate are pressed at a high isostatic pressure using a liquid such as water as a pressure medium, the high-density uniform film structure is formed, which is suitable for this invention. It is preferable that the reduction ratio of the thickness of the thin film be set to 2% or less by the pressing of the thin-film coated substrate.

Therefore, this invention is suitable for the manufacture of a photomask blank for manufacturing a photomask for use in an exposure apparatus using exposure light having a wavelength of 200 nm or less as recited in the Structure 2 or 9.

For example, this invention is suitable for the manufacture of a phase shift mask blank in which the thin film is a phase shift film made of a material containing a compound of transition metal silicide as recited in the Structure 3 or 10 or a binary mask blank in which the thin film is a light-shielding film made of a material containing a compound of transition metal silicide as recited in the Structure 4 or 11. Particularly, this invention is suitable for the manufacture of a phase shift mask blank or a binary mask blank using a phase shift film or a light-shielding film made of a material containing a compound of molybdenum silicide among transition metal silicides (Structure 5 or 12).

This invention is also suitable for the manufacture of a binary mask blank in which the thin film is a light-shielding film made of a material containing chromium as recited in the Structure 6 or 13.

By a photomask manufacturing method comprising a step of patterning, by etching, the thin film in the photomask blank obtained by this invention as recited in the Structure 14, there is obtained a photomask improved in light fastness to short-wavelength exposure light such as ArF excimer laser light and thus significantly improved in mask lifetime.

By a method of manufacturing a photomask having a transfer pattern on a light-transmissive substrate, which comprises forming a thin film on the light-transmissive substrate to produce a photomask blank, patterning the thin film by etching to form the transfer pattern, and then pressing the transfer pattern as recited in the Structure 15, the same operation and effect as those obtained by pressing the thin film in the thin-film coated substrate as described above are also obtained.

It is preferable that the pressing in this case be also carried out by the cold isostatic pressing method in the range of 1000 to 10000 atmospheric pressure as recited in the Structure 16.

According to this invention, by pressing a thin-film coated substrate or a transfer pattern of a thin film formed on a substrate using the thin-film coated substrate, firstly, it is possible to provide photomask blank and photomask manufacturing methods that can make the film structure of the thin film denser (increase the film density) to improve the light fastness of a phase shift film or a light-shielding film to exposure light having a wavelength of 200 nm or less, thereby improving the lifetime of a photomask.

According to this invention, secondly, it is possible to provide photomask blank and photomask manufacturing methods that enable a reduction in thickness of a phase shift film or a light-shielding film.

BEST MODE FOR CARRYING OUT THE INVENTION

Hereinbelow, an embodiment of this invention will be described in detail with reference to the drawings.

This invention is a method of manufacturing a photomask blank having a light-transmissive substrate, and a thin film that is formed on the light-transmissive substrate and adapted to form a transfer pattern and comprises forming the thin film on the light-transmissive substrate to produce a thin-film coated substrate and then pressing the thin-film coated substrate. In this embodiment, the pressing of the thin-film coated substrate is carried out by a cold isostatic pressing method (called a CIP method) in a range of 1000 to 10000 atmospheric pressure.

Figure 1:
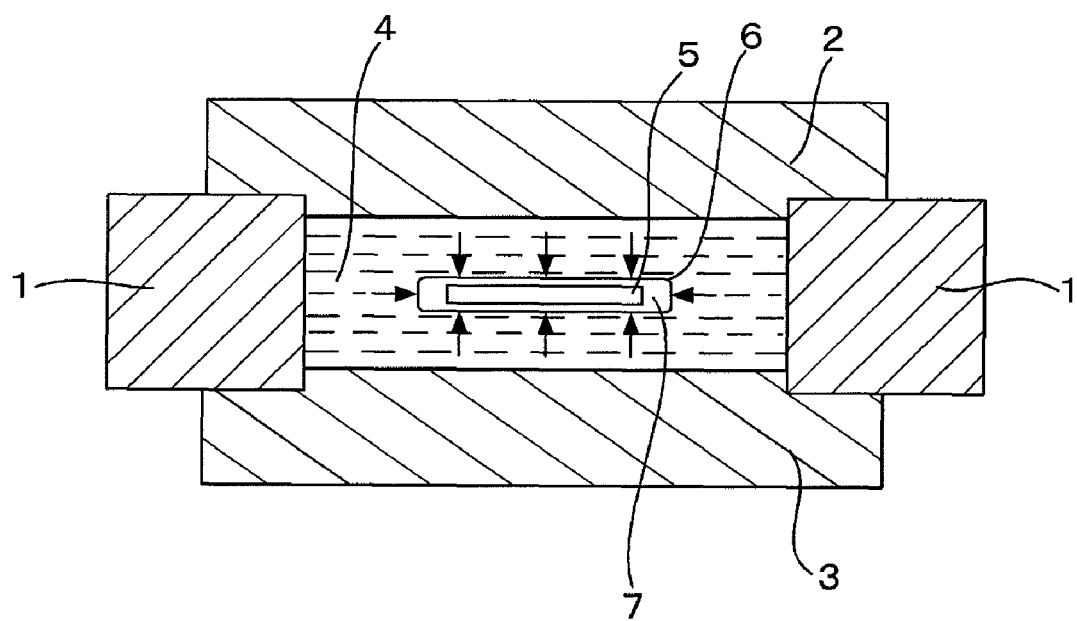
FIG. 1 is a schematic structural diagram of an apparatus for carrying out pressing by a cold isostatic pressing method.

FIG. 1 is a schematic structural diagram of an apparatus for carrying out pressing by the cold isostatic pressing method.

Numeral 1 denotes a high-pressure cylinder having upper and lower openings covered with upper and lower covers 2 and 3, respectively, and a pressure medium 4 is filled in the high-pressure cylinder 1. A liquid such as water or alcohol is used as the pressure medium 4. In the case where a material of a contact portion with the pressure medium 4 inside the high-pressure cylinder 1 is easily subjected to rust of iron or the like (tends to be corroded), the pressure medium 4 preferably contains a rust inhibitor. Numeral 5 denotes a sample to be pressed, which is placed in the pressure medium 4. In this invention, this sample is the above-mentioned thin-film coated substrate. The thin-film coated substrate 5 is sealed in a resin container bag 6 which is appropriately elastically compressible and is filled with a contact pressure medium 7 such as water, thereby being prevented from direct contact with the pressure medium 4. Then, a predetermined pressure is applied to the pressure medium 4 with the movement of the upper cover 2 and this pressure is transmitted to the contact pressure medium 7 through the container bag 6 so that the thin-film coated substrate 5 is pressed by the contact pressure medium 7. As the contact pressure medium 7, it is preferable to use a medium that does not cause a chemical change on the thin film, such as ultrapure water containing substantially no impurities, but filtrate water filtered through a UF (ultrafiltration) membrane, an MF (microfiltration) membrane, or the like may be sufficient. For further increasing the film density by the pressing, it is more preferable to use water containing a high molecular compound (polymeric organic matter, sugar, isopropyl alcohol, or the like) that does not cause a chemical change on the thin film, or alcohol, oil, ethylene glycol, glycerin, or the like having a high molecular weight and a boiling point higher than that of water.

According to the cold isostatic pressing method described above, since the entire surfaces of the thin-film coated substrate 5 are pressed at a high isostatic pressure using the liquid such as water as the pressure medium, the high-density uniform film structure is formed.

The pressing in this case is preferably carried out in the range of, for example, 1000 to 10000 atmospheric pressure for properly obtaining the effect by this invention. The pressing time differs depending on a pressing force, but in general is preferably about 15 minutes for a pressure increase to a predetermined pressure, about 30 minutes in a state where the predetermined pressure is maintained, and about 5 minutes for a pressure drop from the predetermined pressure to an initial pressure. In this case, the pressing may be continuously carried out for a predetermined time (e.g. at 4000 atmospheric pressure for 60 minutes) or the pressing may be carried out for a relatively short time, then once released, and then carried out again, which may be repeated a plurality of times (e.g. maintaining at 4000 atmospheric pressure for 10 minutes is repeated 5 or 6 times). It is more preferable to apply a conventional heat treatment to the thin film before or after the pressing or before and after the pressing.

Further, a heater may be provided outside the high-pressure cylinder 1 for heating at a low temperature of ordinary temperature to about 80° C. simultaneously with the pressing if necessary.

According to the embodiment described above, by pressing the thin-film coated substrate produced by forming the thin film on the light-transmissive substrate, the thin film is squeezed so that the film structure becomes dense (the film density increases), and therefore, the thin film hardly receives the foregoing attack by oxygen, water, or the like and diffusion of constituent molecules of the thin film is suppressed so that it is possible to suppress the formation of the foregoing conventionally formed modified layer. As a result, even if a photomask is repeatedly used with short-wavelength light such as ArF excimer laser light as exposure light, changes in transmittance, phase difference, and line width of, for example, a phase shift film are suppressed. Further, the chemical resistance and hot water resistance are also improved. Thus, the mask lifetime can be significantly improved.

Since the film structure of the thin film becomes dense by pressing the thin-film coated substrate, in the case of, for example, a light-shielding film, a predetermined optical density is obtained even if the thickness thereof is thinner than conventional, and therefore, it is suitable for a reduction in thickness of a resist film and thus for formation of a fine pattern. Since the height of a pattern side wall of the light-shielding film after the photomask fabrication can be reduced, it is suitable for a photomask for use in the immersion exposure technique.

Therefore, this invention is suitable for the manufacture of a photomask blank for manufacturing a photomask for use in an exposure apparatus using exposure light having a short wavelength of 200 nm or less. For example, this invention is suitable for the manufacture of the following photomask blanks.

(1) Phase Shift Mask Blank in Which the Thin Film is a Phase Shift Film Made of a Material Containing a Compound of Transition Metal Silicide (Particularly Molybdenum Silicide)

In the case of the phase shift mask blank manufactured by this invention, when a phase shift mask is produced using this phase shift mask blank, even if the photomask is repeatedly used with short-wavelength light such as ArF excimer laser light as exposure light, changes in transmittance, phase difference, and line width of the phase shift film are suppressed. Further, the chemical resistance and hot water resistance are also improved. Thus, the performance is not degraded so that the lifetime of the photomask can be significantly improved.

Figure 4:
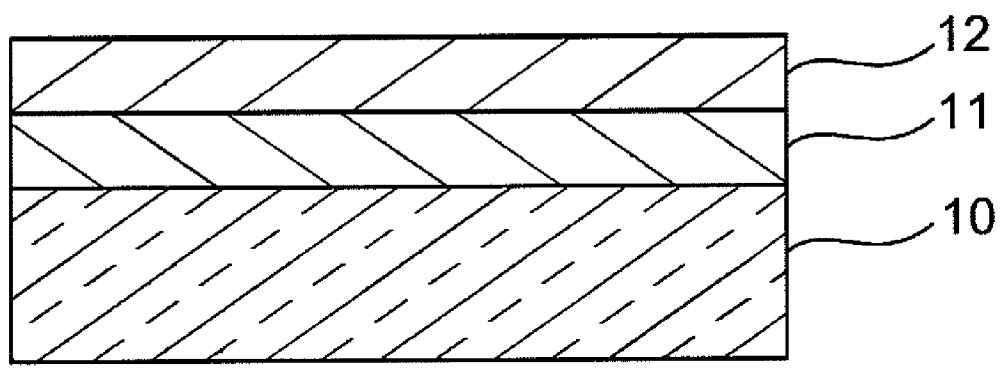
FIG. 4 is a sectional view showing one example of a phase shift mask blank.

Such a phase shift mask blank has, for example, as shown in FIG. 4, a structure in which a halftone phase shift film 11 is formed on a light-transmissive substrate 10 and a light-shielding film 12 is formed on the halftone phase shift film 11.

The phase shift film is adapted to transmit light having an intensity that does not substantially contribute to exposure (e.g. 1% to 20% with respect to an exposure wavelength) and to produce a predetermined phase difference (e.g. 180 degrees). By the use of light-semitransmissive portions formed by patterning the phase shift film and light-transmissive portions formed with no phase shift film and adapted to transmit light having an intensity that substantially contributes to exposure, the phase shift mask causes the phase of the light transmitted through the light-semitransmissive portions to be substantially inverted with respect to that of the light transmitted through the light-transmissive portions so that the lights having passed near the boundaries between the light-semitransmissive portions and the light-transmissive portions and bent into the others' regions due to diffraction cancel each other out. This makes the light intensity at the boundaries approximately zero to thereby improve the contrast, i.e. the resolution, at the boundaries.

The phase shift film is made of a material containing a transition metal silicide compound and there can be cited a material mainly composed of transition metal silicide and oxygen and/or nitrogen. As a transition metal, use can be made of molybdenum, tantalum, tungsten, titanium, chromium, hafnium, nickel, vanadium, zirconium, ruthenium, rhodium, or the like. The phase shift film may be in the form of a single layer or a plurality of layers.

(2) Binary Mask Blank in Which the Thin Film is a Light-Shielding Film Made of a Material Containing a Compound of Transition Metal Silicide (Particularly Molybdenum Silicide)

In the case of the binary mask blank with the transition metal silicide-based light-shielding film manufactured by this invention, when a binary mask is produced using this binary mask blank, even if the photomask is repeatedly used with short-wavelength light such as ArF excimer laser light as exposure light, a reduction in light-shielding properties of the light-shielding film and a change in line width thereof are suppressed. Further, the chemical resistance and hot water resistance are also improved. Thus, the performance is not degraded so that the lifetime of the photomask can be significantly improved.

Such a binary mask blank has a structure in which the light-shielding film is formed on a light-transmissive substrate. The light-shielding film is made of a material containing a transition metal silicide compound and there can be cited a material mainly composed of transition metal silicide and oxygen and/or nitrogen. As a transition metal, use can be made of molybdenum, tantalum, tungsten, titanium, chromium, hafnium, nickel, vanadium, zirconium, ruthenium, rhodium, or the like.

Particularly, when the light-shielding film is made of molybdenum silicide compounds and has a two-layer structure of a light-shielding layer (MoSi, MoSiN, or the like) and a front-surface antireflection layer (MoSiON or the like) or a three-layer structure further comprising a back-surface antireflection layer (MoSiON or the like) between the light-shielding layer and a substrate, the content of Mo and Si in the molybdenum silicide compound of the light-shielding layer is such that Mo is preferably 9% or more and 40% or less (preferably 15% or more and 40% or less and more preferably 20% or more and 40% or less) in terms of the light-shielding properties.

(3) Binary Mask Blank in Which the Thin Film is a Light-Shielding Film Made of a Material Containing Chromium In the case of the binary mask blank with the chromium-based light-shielding film manufactured by this invention, when a binary mask is produced using this binary mask blank, even if the photomask is repeatedly used with short-wavelength light such as ArF excimer laser light as exposure light, a reduction in light-shielding properties of the light-shielding film and a change in line width thereof are suppressed. Further, the chemical resistance and hot water resistance are also improved. Thus, the performance is not degraded so that the lifetime of the photomask can be significantly improved.

Such a binary mask blank has a structure in which the light-shielding film is formed on a light-transmissive substrate. The light-shielding film is made of a material containing chromium and there can be cited chromium alone or a material containing chromium and oxygen, nitrogen, carbon, or the like. The light-shielding film may be in the form of a single layer or a plurality of layers (e.g. a laminated structure of a light-shielding layer and an antireflection layer). When forming the light-shielding film by laminating the light-shielding layer and the antireflection layer, the antireflection layer may be made of a chromium-based material or a transition metal silicide-based material (e.g. $SiO_2$, SiON, MSiO, or MSiON (M is a transition metal such as molybdenum)).

Between a transmissive substrate and a phase shift film, between a transmissive substrate and a light-shielding film, or between a phase shift film and a light-shielding film, an etching stopper film having etching resistance to the phase shift film or the light-shielding film may be provided. Further, an etching mask film having etching resistance to the light-shielding film may be provided on the light-shielding film.

This invention also provides a photomask manufacturing method comprising a step of patterning, by etching, the thin film in the photomask blank obtained by this invention. As the etching in this event, use is preferably made of dry etching effective for forming a fine pattern.

According to such a photomask manufacturing method, there is obtained a photomask improved in light fastness to short-wavelength exposure light such as ArF excimer laser light, chemical resistance, and hot water resistance so that degradation of the properties due to exposure light irradiation is suppressed even if the photomask is repeatedly used and the lifetime of the photomask is significantly improved.

This invention also provides a method of manufacturing a photomask having a transfer pattern on a light-transmissive substrate, which comprises forming a thin film on the light-transmissive substrate to produce a photomask blank, patterning the thin film by etching to form the transfer pattern, and then pressing the transfer pattern. As the etching in this event, use is preferably made of dry etching effective for forming a fine pattern.

According to such a photomask manufacturing method, the same operation and effect as those obtained by pressing the thin-film coated substrate at the stage where the thin-film coated substrate is produced are also obtained and thus there is obtained a photomask improved in light fastness to short-wavelength exposure light such as ArF excimer laser light, chemical resistance, and hot water resistance so that degradation of the properties due to exposure light irradiation is suppressed even if the photomask is repeatedly used and the lifetime of the photomask is significantly improved. The pressing in this case is also preferably carried out to press the transfer pattern by the cold isostatic pressing method in the range of 1000 to 10000 atmospheric pressure.

EXAMPLES

Hereinbelow, the embodiment of this invention will be described in further detail in terms of Examples. A description will also be given of a Comparative Example in contrast to the Examples.

Example 1

Using a single-wafer sputtering apparatus and using a mixed target of molybdenum (Mo) and silicon (Si) (at % ratio Mo:Si=10:90) as a sputtering target, reactive sputtering (DC sputtering) was carried out by setting the power of a DC power supply to 3.0 kW in a mixed gas atmosphere of argon (Ar) and nitrogen ($N_2$) (gas pressure 0.2 Pa; gas flow rate ratio Ar:$N_2$=10:90), thereby forming, on a light-transmissive substrate of quartz glass, a phase shift film for ArF excimer laser light (wavelength: 193 nm) in the form of a single layer mainly composed of molybdenum, silicon, and nitrogen and having a thickness of 69 nm. The phase shift film had a transmittance of 5.24% and a phase difference of 173.85 degrees for ArF excimer laser light (wavelength: 193 nm).

Then, using an in-line sputtering apparatus and using a chromium target as a sputtering target, reactive sputtering was carried out in a mixed gas atmosphere of argon, nitrogen, and helium (gas pressure 0.2 Pa; gas flow rate ratio Ar:$N_2$:He=30:30:40), thereby forming a light-shielding layer having a thickness of 24 nm. Then, reactive sputtering was carried out in a mixed gas atmosphere of argon, methane, and helium (gas pressure 0.3 Pa; gas flow rate ratio Ar:$CH_4$:He=63:2:40) and, continuously, reactive sputtering was carried out in a mixed gas atmosphere of argon, methane, nitrogen monoxide, and helium (gas pressure 0.3 Pa; gas flow rate ratio Ar:$CH_4$:NO:He=63:2:3:40), thereby forming an antireflection layer having a thickness of 24 nm. Through the processes described above, a light-shielding film comprising the light-shielding layer and the antireflection layer and having a total thickness of 48 nm was formed. The light-shielding film had an optical density (OD) of 3.1 in the laminated structure with the phase shift film.

Then, a phase shift mask blank (thin-film coated mask blank) thus obtained was pressed using the apparatus shown in FIG. 1. Water added with a rust inhibitor was used as a pressure medium and ethylene glycol was used as a contact pressure medium. In this Example, the pressing was performed by carrying out pressing for a short time, then once releasing the pressing, and then carrying out pressing again, which was repeated a plurality of times, so that, specifically, maintaining at 9000 atmospheric pressure at 40° C. for 10 minutes was repeated 6 times. After the pressing, the total thickness of the thin films (thickness of the phase shift film+ thickness of the light-shielding film) was measured to be 113 nm. Since the total thickness of the thin films before the pressing was 117 nm, a reduction in film thickness of 4 nm (film thickness reduction ratio of 3.4%) was achieved by the pressing. Herein, the film thickness reduction ratio is a value of {(film thickness before pressing−film thickness after pressing)/film thickness before pressing}×100(%). Another phase shift mask blank formed with a phase shift film and a light-shielding film on a light-transmissive substrate under the same film forming conditions and subjected to pressing under the same pressing conditions was subjected again to pressing in which maintaining at 4000 atmospheric pressure at 40° C. for 10 minutes was repeated 6 times, resulting in a film thickness change of less than 1 nm. That is, once the above-mentioned pressing is carried out, even if the thin films are pressed again at, for example, 4000 atmospheric pressure, the change in thickness of the thin films after the pressing is very small.

Further, another phase shift mask blank formed with only a phase shift film on a light-transmissive substrate under the same film forming conditions was manufactured and subjected to pressing under the same pressing conditions. Then, it was confirmed that while the film density of the phase shift film before the pressing was 3.23 g/cm$^3$, the film density of the phase shift film after the pressing was 3.28 g/cm$^3$ and thus was increased by 1.5%.

Then, using the phase shift mask blank subjected to the pressing as described above, a phase shift mask was manufactured. First, a chemically amplified positive resist film for electron beam writing (FEP171 manufactured by FUJIFILM Electronic Materials Co., Ltd.) was formed on the mask blank. The resist film was formed by spin coating using a spinner (spin coating apparatus). After coating the resist film, a predetermined heated-air drying treatment was carried out using a heated-air dryer.

Then, using an electron beam writing apparatus, a required pattern was written on the resist film formed on the mask blank and, thereafter, the resist film was developed with a predetermined developer, thereby forming a resist pattern.

Then, using the resist pattern as a mask, the light-shielding film composed of the light-shielding layer and the antireflection layer was dry-etched, thereby forming a light-shielding film pattern. A mixed gas of $Cl_2$ and $O_2$ (gas flow rate ratio $Cl_2$:$O_2$=4:1) was used as a dry etching gas.

Then, using the light-shielding film pattern as a mask, the phase shift film was dry-etched, thereby forming a phase shift film pattern. A mixed gas of $SF_6$ and He was used as a dry etching gas.

Then, after stripping the remaining resist pattern, a resist film, which was the same as that described above, was coated again and, after writing a pattern to be used for removing an unnecessary portion of the light-shielding film pattern in a transfer area, the resist film was developed, thereby forming a resist pattern. Then, the unnecessary portion of the light-shielding film pattern was removed by dry etching and then the remaining resist pattern was stripped, thereby obtaining a phase shift mask. There was almost no change in transmittance and phase difference of the phase shift film as compared with those at the time of the film formation.

ArF excimer laser light (wavelength: 193 nm) was continuously irradiated on the obtained phase shift mask so that the total dose became 30 kJ/cm². The dose of 30 kJ/cm² (energy density: about 25 mJ/cm²) corresponds to use of about 100,000 times of a photomask and corresponds to use for about three months with a normal frequency of use of a photomask.

The transmittance and phase difference of the phase shift film after the irradiation were measured. As a result, the transmittance was 5.85% and the phase difference was 172.83 degrees for ArF excimer laser light (wavelength: 193 nm). Therefore, amounts of change in transmittance and phase difference after the irradiation were such that the transmittance was increased by 0.61% and the phase difference was reduced by 1.02 degrees, and thus, the change amounts were suppressed to be small and the change amounts on this level do not affect the performance of the photomask. Further, a section of the phase shift film pattern was observed in detail using a TEM (transmission electron microscope). As a result, a modified layer was not particularly confirmed and an increase in line width was hardly confirmed (CD change: less than 1 nm).

Comparative Example

A phase shift film, which was the same as that in Example 1, was formed on a light-transmissive substrate of quartz glass, then a heat treatment was carried out at 280° C. for 60 minutes, and then a light-shielding film having a laminated structure of a light-shielding layer and an antireflection layer, which were the same as those in Example 1, was formed on the phase shift film, thereby obtaining a phase shift mask blank (thin-film coated mask blank). However, the pressing carried out in Example 1 was not carried out.

Then, using the phase shift mask blank subjected to the heat treatment as described above, a phase shift mask was manufactured in the same manner as in Example 1. The phase shift film had a transmittance of 6.16% and a phase difference of 177.2 degrees for ArF excimer laser light (wavelength: 193 nm).

ArF excimer laser light (wavelength: 193 nm) was continuously irradiated on the obtained phase shift mask so that the total dose became 30 kJ/cm² (energy density: about 25 mJ/cm²), and then the transmittance and phase difference of the phase shift film after the irradiation were measured. As a result, the transmittance was 9.12% and the phase difference was 170.2 degrees for ArF excimer laser light (wavelength: 193 nm). Therefore, amounts of change in transmittance and phase difference after the irradiation were such that the transmittance was increased by 2.96% and the phase difference was reduced by 7.0 degrees, and thus, the change amounts were very large and, when the change amounts on this level occur, the phase shift mask cannot be used as a photomask any longer. Further, a section of a phase shift film pattern was observed in detail using a TEM (transmission electron microscope). As a result, a modified layer was confirmed and an increase in line width due to the modified layer was confirmed (CD change: 6 nm).

Example 2

A phase shift mask blank (thin-film coated mask blank) having a phase shift film and a light-shielding film on a light-transmissive substrate was manufactured under the same conditions as in Example 1 and pressing was carried out in the same manner as in Example 1 using the apparatus shown in FIG. 1. The pressing conditions were the same as in Example 1 except that the maintaining pressure was set to 4000 atmospheric pressure. After the pressing, the total thickness of the thin films (thickness of the phase shift film+ thickness of the light-shielding film) was measured to be 114.5 nm. Since the total thickness of the thin films before the pressing was 117 nm, a reduction in film thickness of 2.5 nm (film thickness reduction ratio of 2.1%) was achieved by the pressing.

Another phase shift mask blank formed with only a phase shift film on a light-transmissive substrate under the same film forming conditions was manufactured and subjected to pressing under the same pressing conditions. Then, it was confirmed that while the film density of the phase shift film before the pressing was 3.23 g/cm³, the film density of the phase shift film after the pressing was 3.26 g/cm³ and thus was increased by 0.9%.

Further, another phase shift mask blank formed with a phase shift film and a light-shielding film on a light-transmissive substrate under the same film forming conditions and subjected to pressing under the same pressing conditions was subjected again to pressing in which maintaining at 4000 atmospheric pressure at 40° C. for 10 minutes was repeated 6 times, resulting in a film thickness change of less than 1 nm.

Then, using the phase shift mask blank subjected to the pressing as described above, a phase shift mask was manufactured in the same manner as in Example 1. ArF excimer laser light (wavelength: 193 nm) was continuously irradiated on the obtained phase shift mask so that the total dose became 30 kJ/cm², and then the transmittance and phase difference of the phase shift film after the irradiation were measured. As a result, the transmittance was 6.51% and the phase difference was 172.06 degrees for ArF excimer laser light (wavelength: 193 nm). Therefore, amounts of change in transmittance and phase difference after the irradiation were such that the transmittance was increased by 1.27% and the phase difference was reduced by 1.79 degrees, and thus, the change amounts were suppressed to be small and the change amounts on this level do not affect the performance of the photomask. Further, a section of a phase shift film pattern was observed in detail using a TEM (transmission electron microscope). As a result, a modified layer was not particularly confirmed and an increase in line width was hardly confirmed (CD change: less than 1 nm).

Example 3

A phase shift mask blank (thin-film coated mask blank) having a phase shift film and a light-shielding film on a light-transmissive substrate was manufactured under the same conditions as in Example 1 and pressing was carried out in the same manner as in Example 1 using the apparatus shown in FIG. 1. The pressing conditions were the same as in Example 1 except that isopropyl alcohol was used as a contact pressure medium instead of ethylene glycol. After the pressing, the total thickness of the thin films (thickness of the phase shift film+thickness of the light-shielding film) was measured to be 113 nm. Since the total thickness of the thin films before the pressing was 117 nm, a reduction in film thickness of 4 nm (film thickness reduction ratio of 3.4%) was achieved by the pressing.

Another phase shift mask blank formed with only a phase shift film on a light-transmissive substrate under the same film forming conditions was manufactured and subjected to pressing under the same pressing conditions. Then, it was confirmed that while the film density of the phase shift film before the pressing was 3.23 g/cm³, the film density of the phase shift film after the pressing was 3.32 g/cm³ and thus was increased by 2.8%.

Further, another phase shift mask blank formed with a phase shift film and a light-shielding film on a light-transmissive substrate under the same film forming conditions and subjected to pressing under the same pressing conditions was subjected again to pressing in which maintaining at 4000 atmospheric pressure at 40° C. for 10 minutes was repeated 6 times, resulting in a film thickness change of less than 1 nm.

Then, using the phase shift mask blank subjected to the pressing as described above, a phase shift mask was manufactured in the same manner as in Example 1. ArF excimer laser light (wavelength: 193 nm) was continuously irradiated on the obtained phase shift mask so that the total dose became 30 kJ/cm$^2$, and then the transmittance and phase difference of the phase shift film after the irradiation were measured. As a result, the transmittance was 6.11% and the phase difference was 172.64 degrees for ArF excimer laser light (wavelength: 193 nm). Therefore, amounts of change in transmittance and phase difference after the irradiation were such that the transmittance was increased by 0.87% and the phase difference was reduced by 1.21 degrees, and thus, the change amounts were suppressed to be small and the change amounts on this level do not affect the performance of the photomask. Further, a section of a phase shift film pattern was observed in detail using a TEM (transmission electron microscope). As a result, a modified layer was not particularly confirmed and an increase in line width was hardly confirmed (CD change: less than 1 nm).

Example 4

Using a single-wafer sputtering apparatus and using a mixed target of molybdenum (Mo) and silicon (Si) (at % ratio Mo:Si=21:79) as a sputtering target, reactive sputtering (DC sputtering) was carried out by setting the power of a DC power supply to 3.0 kW in a mixed gas atmosphere of argon (Ar), oxygen, nitrogen, and helium (gas pressure 0.2 Pa; gas flow rate ratio Ar:O$_2$:N$_2$:He=5:4:49:42), thereby forming a MoSiON film (back-surface antireflection layer) having a thickness of 7 nm on a light-transmissive substrate of quartz glass. Subsequently, using a Mo/Si target of the same mixing ratio, reactive sputtering was carried out by setting the power of the DC power supply to 2.0 kW in a mixed gas atmosphere of argon and helium (gas pressure 0.3 Pa; gas flow rate ratio Ar:He=20:120), thereby forming a MoSi film (light-shielding layer) having a thickness of 30 nm. Subsequently, using a Mo/Si target (at % ratio Mo:Si=4:96), reactive sputtering was carried out by setting the power of the DC power supply to 3.0 kW in a mixed gas atmosphere of argon, oxygen, nitrogen, and helium (gas pressure 0.1 Pa; gas flow rate ratio Ar:O$_2$:N$_2$:He=6:5:11:16), thereby forming a MoSiON film (front-surface antireflection layer) having a thickness of 15 nm. Thus, a light-shielding film (total thickness: 52 nm) for ArF excimer laser light (wavelength: 193 nm) having a laminated structure of the MoSiON film, the MoSi film, and the MoSiON film was formed. This light-shielding film had an optical density of 3.0 for ArF excimer laser light (wavelength: 193 nm).

Then, a binary mask blank (thin-film coated photomask blank) thus obtained was pressed in the same manner as in Example 1 using the apparatus shown in FIG. 1. The pressing conditions were the same as in Example 1. After the pressing, the total thickness of the thin films (thickness of the light-shielding film) was measured to be 50 nm. Since the total thickness of the thin films before the pressing was 52 nm, a reduction in film thickness of 2 nm (film thickness reduction ratio of 3.8%) was achieved by the pressing. It was also confirmed that the film density of the thin films was increased by the pressing.

Further, another binary mask blank formed with a light-shielding film on a light-transmissive substrate under the same film forming conditions and subjected to pressing under the same pressing conditions was subjected again to pressing in which maintaining at 4000 atmospheric pressure at 40° C. for 10 minutes was repeated 6 times, resulting in a film thickness change of less than 1 nm.

Then, using the binary mask blank subjected to the pressing as described above, a binary mask was manufactured. First, a chemically amplified positive resist film for electron beam writing (PRL009 manufactured by FUJIFILM Electronic Materials Co., Ltd.) was formed on the mask blank.

Then, using an electron beam writing apparatus, a required pattern was written on the resist film and, thereafter, the resist film was developed with a predetermined developer, thereby forming a resist pattern.

Then, using the resist pattern as a mask, the light-shielding film having the laminated structure of the MoSiON film, the MoSi film, and the MoSiON film was dry-etched, thereby forming a light-shielding film pattern. A mixed gas of SF$_6$ and He was used as a dry etching gas.

Then, the remaining resist pattern was stripped, thereby obtaining a binary mask. There was almost no change in transmittance of the light-shielding film as compared with that at the time of the film formation.

ArF excimer laser light (wavelength: 193 nm) was continuously irradiated on the obtained photomask so that the total dose became 30 kJ/cm$^2$, and then the optical density of the light-shielding film after the irradiation was measured. As a result, the optical density was 3.0 for ArF excimer laser light (wavelength: 193 nm) and thus there was no change. The front-surface reflectance and the back-surface reflectance of the light-shielding film for exposure light were 21.2% and 29.1%, respectively, which were sufficiently low reflectance values that do not affect pattern transfer. Further, a section of the light-shielding film pattern was observed in detail using a TEM (transmission electron microscope). As a result, a modified layer was confirmed and an increase in line width due to the modified layer was confirmed (CD change: 1 nm), but the accuracy is sufficiently high as a photomask for the semiconductor design rule hp 32 nm and subsequent generations.

Example 5

Using an in-line sputtering apparatus and using a chromium target as a sputtering target, reactive sputtering was carried out in a mixed gas atmosphere of argon and nitrogen (gas pressure 0.3 Pa; gas flow rate ratio Ar:N$_2$=72:28) to form a CrN film on a light-transmissive substrate of quartz glass, then reactive sputtering was carried out in a mixed gas atmosphere of argon and methane (gas pressure 0.3 Pa; gas flow rate ratio Ar:CH$_4$=97:8) to form a CrC film, and then reactive sputtering was carried out in a mixed gas atmosphere of argon and nitrogen monoxide (gas pressure 0.3 Pa; gas flow rate ratio Ar:NO=97:3) to form a CrON film, thereby forming a light-shielding film having a total thickness of 73 nm. This light-shielding film had an optical density of 3.0 for ArF excimer laser light (wavelength: 193 nm).

Figure 2:
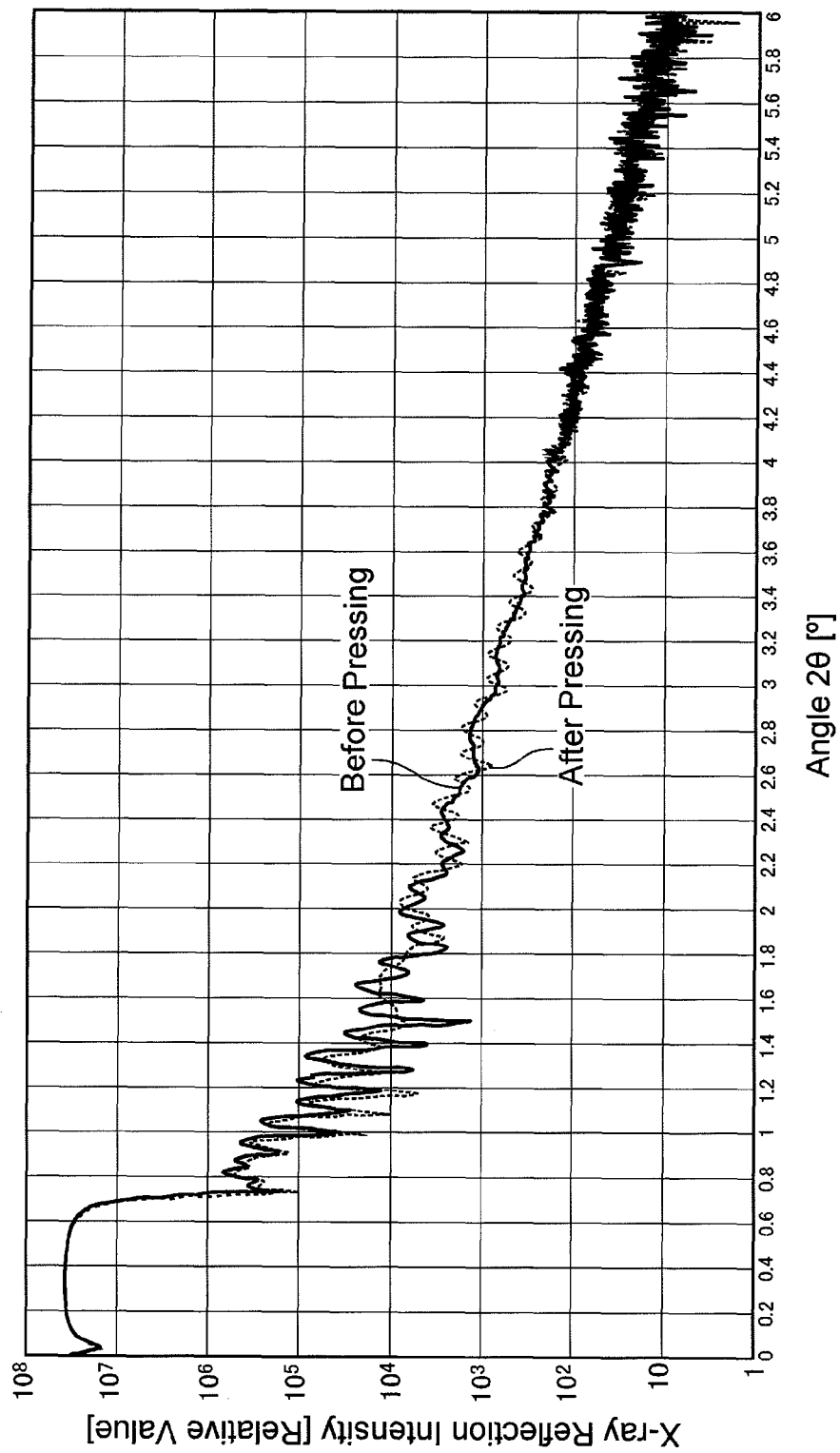
FIG. 2 is a diagram about the X-ray reflection intensity of a thin-film coated photomask blank before and after pressing.
Figure 3:
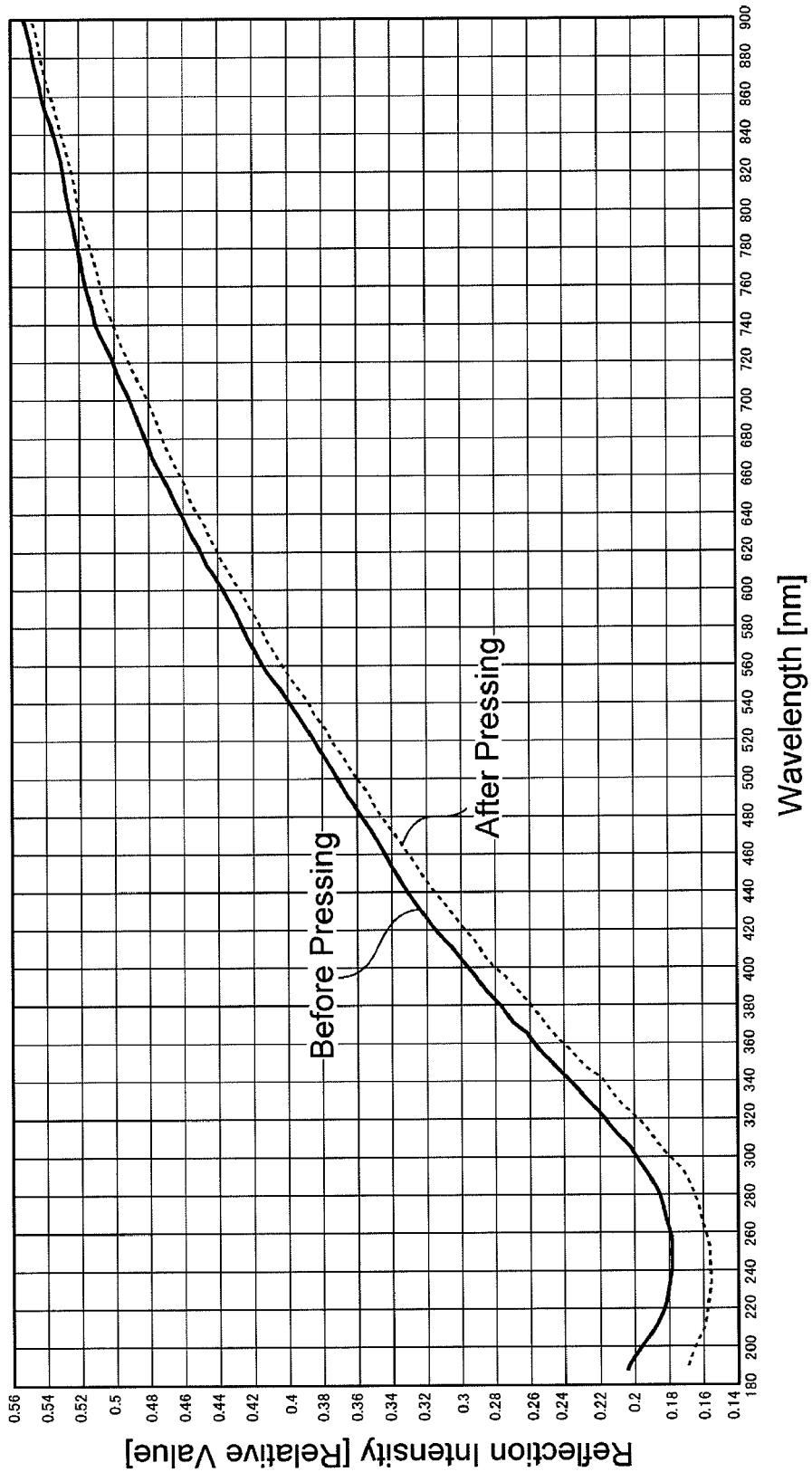
FIG. 3 is a diagram about the reflection intensity spectrum of a thin-film coated photomask blank before and after pressing.

Then, a chromium-based binary mask blank (thin-film coated photomask blank) thus obtained was pressed in the same manner as in Example 1 using the apparatus shown in FIG. 1. The pressing conditions were the same as in Example 1. After the pressing, the total thickness of the thin films (thickness of the light-shielding film) was measured to be 69 nm. Since the total thickness of the thin films before the pressing was 73 nm, a reduction in film thickness of 4 nm (film thickness reduction ratio of 5.8%) was achieved by the pressing. Further, XRR measurement for measuring the reflection intensity using an X-ray was performed before and after the pressing. As a result, as shown in FIG. 2, a change in the entire thin film structure due to the pressing was confirmed as a difference in reflection intensity waveform. Further, reflection spectrum measurement of the thin films was performed before and after the pressing. As a result, as shown in FIG. 3, a change in the entire thin film structure was confirmed as a difference in reflection intensity spectrum and it was confirmed that the film density of the thin films was increased by the pressing.

Further, another binary mask blank formed with a light-shielding film on a light-transmissive substrate under the same film forming conditions and subjected to pressing under the same pressing conditions was subjected again to pressing in which maintaining at 4000 atmospheric pressure at 40° C. for 10 minutes was repeated 6 times, resulting in a film thickness change of less than 1 nm.

Then, using the photomask blank subjected to the pressing as described above, a binary mask was manufactured. First, a chemically amplified positive resist film for electron beam writing (FEP171 manufactured by FUJIFILM Electronic Materials Co., Ltd.) was formed on the photomask blank.

Then, using an electron beam writing apparatus, a required pattern was written on the resist film and, thereafter, the resist film was developed with a predetermined developer, thereby forming a resist pattern.

Then, using the resist pattern as a mask, the light-shielding film having a laminated structure of the CrN film, the CrC film, and the CrON film was dry-etched, thereby forming a light-shielding film pattern. A mixed gas of $Cl_2$ and $O_2$ (gas flow rate ratio $Cl_2:O_2=4:1$) was used as a dry etching gas.

Then, the remaining resist pattern was stripped, thereby obtaining a binary mask. There was almost no change in transmittance of the light-shielding film as compared with that at the time of the film formation.

ArF excimer laser light (wavelength: 193 nm) was continuously irradiated on the obtained photomask so that the total dose became 30 kJ/cm$^2$, and then the optical density of the light-shielding film after the irradiation was measured. As a result, the optical density was 3.0 for ArF excimer laser light (wavelength: 193 nm) and thus there was no change. The front-surface reflectance of the light-shielding film for exposure light was 17.4%, which was a sufficiently low reflectance value that does not affect pattern transfer. Further, a section of the light-shielding film pattern was observed in detail using a TEM (transmission electron microscope). As a result, a modified layer was confirmed and an increase in line width due to the modified layer was confirmed (CD change: 2 nm), but the accuracy is sufficiently high as a photomask for the semiconductor design rule hp 80 nm and subsequent generations.

Example 6

A phase shift film and a light-shielding film were formed on a light-transmissive substrate under the same conditions as in Example 1, thereby manufacturing a phase shift mask blank (thin-film coated mask blank) without carrying out pressing after the film formation. Then, using the phase shift mask blank thus manufactured, a phase shift mask was manufactured in the same manner as in Example 1.

Then, the phase shift mask thus manufactured was pressed using the apparatus shown in FIG. 1. The pressing conditions were the same as in Example 1. After the pressing, the total thickness of a transfer pattern (thin films) (thickness of the phase shift film+thickness of the light-shielding film) was measured to be 113 nm. Since the total thickness of the transfer pattern (thin films) before the pressing was 117 nm, a reduction in film thickness of 4 nm (film thickness reduction ratio of 3.4%) was achieved by the pressing.

Another phase shift mask blank formed with only a phase shift film on a light-transmissive substrate under the same film forming conditions was manufactured, then patterning was applied to the phase shift film to manufacture a phase shift mask, and then this phase shift mask was pressed under the same pressing conditions. Then, it was confirmed that while the film density of the phase shift film before the pressing was 3.23 g/cm$^3$, the film density of the phase shift film after the pressing was 3.26 g/cm$^3$ and thus was increased by 0.9%.

ArF excimer laser light (wavelength: 193 nm) was continuously irradiated on the phase shift mask subjected to the pressing so that the total dose became 30 kJ/cm$^2$, and then the transmittance and phase difference of the phase shift film after the irradiation were measured. As a result, the transmittance was 6.53% and the phase difference was 172.09 degrees for ArF excimer laser light (wavelength: 193 nm). Therefore, amounts of change in transmittance and phase difference after the irradiation were such that the transmittance was increased by 1.29% and the phase difference was reduced by 1.76 degrees, and thus, the change amounts were suppressed to be small and the change amounts on this level do not affect the performance of the photomask. Further, a section of a phase shift film pattern was observed in detail using a TEM (transmission electron microscope). As a result, a modified layer was not particularly confirmed and an increase in line width was hardly confirmed (CD change: less than 1 nm).

While this invention has been described with reference to the Examples, this invention is not limited thereto. Various changes that can be understood by a person skilled in the art can be made to the structures and details of this invention within the spirit and scope of this invention described in claims.

What is claimed is:

1. A method of manufacturing a photomask blank comprising a light-transmissive substrate, and a thin film that is formed on the light-transmissive substrate and adapted to form a transfer pattern, said method comprising:
   forming said thin film on said light-transmissive substrate to produce a thin-film coated substrate; and
   pressing said thin-film coated substrate after the thin film formation,
   wherein said pressing is carried out by a cold isostatic pressing method in a range of 1000 to 10000 atmospheric pressure.

2. The method according to claim 1, wherein said photomask blank is a photomask blank that manufactures a photomask for use in an exposure apparatus using exposure light having a wavelength of 200 nm or less.

3. The method according to claim 1, wherein said thin film is a phase shift film made of a material containing a compound of transition metal silicide.

4. The method according to claim 3, wherein said transition metal silicide is molybdenum silicide.

5. The method according to claim 1, wherein said thin film is a light-shielding film made of a material containing a compound of transition metal silicide.

6. The method according to claim 5, wherein said transition metal silicide is molybdenum silicide.

7. The method according to claim 1, wherein said thin film is a light-shielding film made of a material containing chromium.

8. The method according to claim 1, wherein said pressing is conducted by said thin film being pressed by a contact pressure medium, said contact pressure medium is water containing a high molecular compound or liquid having a high molecular weight and a boiling point higher than that of water.

9. A method of manufacturing a photomask comprising a transfer pattern on a light-transmissive substrate, said method comprising:

preparing a photomask blank with which a thin film is formed on said light-transmissive substrate;

patterning said thin film by etching to form said transfer pattern; and pressing the light-transmissive substrate having said transfer pattern after the patterning, wherein said pressing is carried out by a cold isostatic pressing method in a range of 1000 to 10000 atmospheric pressure.

10. The method according to claim 9, wherein said pressing is conducted by said thin film being pressed by a contact pressure medium, said contact pressure medium is water containing a high molecular compound or a liquid having a high molecular weight and a boiling point higher than that of water.

* * * * *